July 7, 1964 L. G. EVELOVE 3,140,137

ELECTRICAL CIRCUIT BOARD MOUNTING ARRANGEMENTS

Filed Aug. 14, 1961

INVENTOR:
Leon George Evelove

By Alan C. Rose
Attorney

United States Patent Office 3,140,137
Patented July 7, 1964

3,140,137

ELECTRICAL CIRCUIT BOARD MOUNTING ARRANGEMENTS

Leon George Evelove, Canoga Park, Calif., assignor to Litton Systems, Inc., Beverly Hills, Calif.

Filed Aug. 14, 1961, Ser. No. 131,287
5 Claims. (Cl. 339—17)

This invention relates to printed circuit boards, and more particularly, to techniques for mounting such boards.

Printed circuit boards characteristically have a great many contacts for interconnection with other circuits in the over-all system of which they form a part. As a printed circuit board is inserted into the supporting frame, its contacts are normally engaged by the matching contacts of a connector receptacle. In many systems, the matching contacts where the circuit board enters the receptacle have been found to be the source of system failures. Thus, for specific example, the contacts are usually plated with a thin coating of a good contact material on a resilient metal backing member. It has been found that the contact surfaces tend to fail to a much greater degree than would be expected from the infrequent insertions or removals of the boards.

The principal object of the invention, therefore, is to eliminate electrical connection failures in printed circuit mounting arrangements.

In accordance with the present invention, it has been determined that the electrical connector failures resulted principally from nearly imperceptible vibrations of the circuit board with respect to the connector receptacle. Thus, the receptacle was fixed to the main frame of the computer system and the light weight printed circuit board was resiliently mounted in the receptacle. When the entire apparatus was subject to normal high frequency vibration, the circuit board would vibrate with respect to the fixed receptacle or connector strip. The reason for the vibration of the board with respect to the frame is the thin and resilient nature of printed circuit boards. Normally they are made of several layers of fiberglass impregnated with plastic. Subsequent to manufacture, they are loaded with transistors and other electrical components. The loading of the resilient boards creates a resonant system which produces many vibrations at high frequencies. These vibrations accelerate the wear on the contacting surfaces. The connector failures were a direct result of this contact wear.

In accordance with the present invention, this difficulty has been overcome by resiliently mounting the connector receptacles with respect to the main frame of the apparatus so that the printed circuit board and the receptacle vibrate as a unit with respect to the main frame. To accomplish this result, it is necessary that the stiffness of the mating electrical contacts which both support the printed circuit board and electrically interconnect it with the receptacle be significantly greater than the stiffness of the resilient mounting structure for the receptacle. In accordance with additional features of the invention, locking mechanisms may be provided which hold the printed circuit boards into engagement with the receptacles and also force the receptacle to assume a spaced position with respect to the main frame of the system. Collateral apparatus which may advantageously be employed, include plastic guides which make a snap-fit with the frame of the apparatus and multiple O-ring assemblies which form the resilient portion of the receptacle mounting structure.

Following the change in mounting design from one in which the receptacles were rigidly secured to the frame to the present resilient mounting arrangement, a remarkable decrease in circuit failures was observed.

Other objects, features and advantages of the present invention may be readily apprehended from a consideration of the following detailed description, from the claims appended to the present specification, and from the illustrative embodiment of the invention shown in the drawings.

Figures 1, 2, 3, 4:
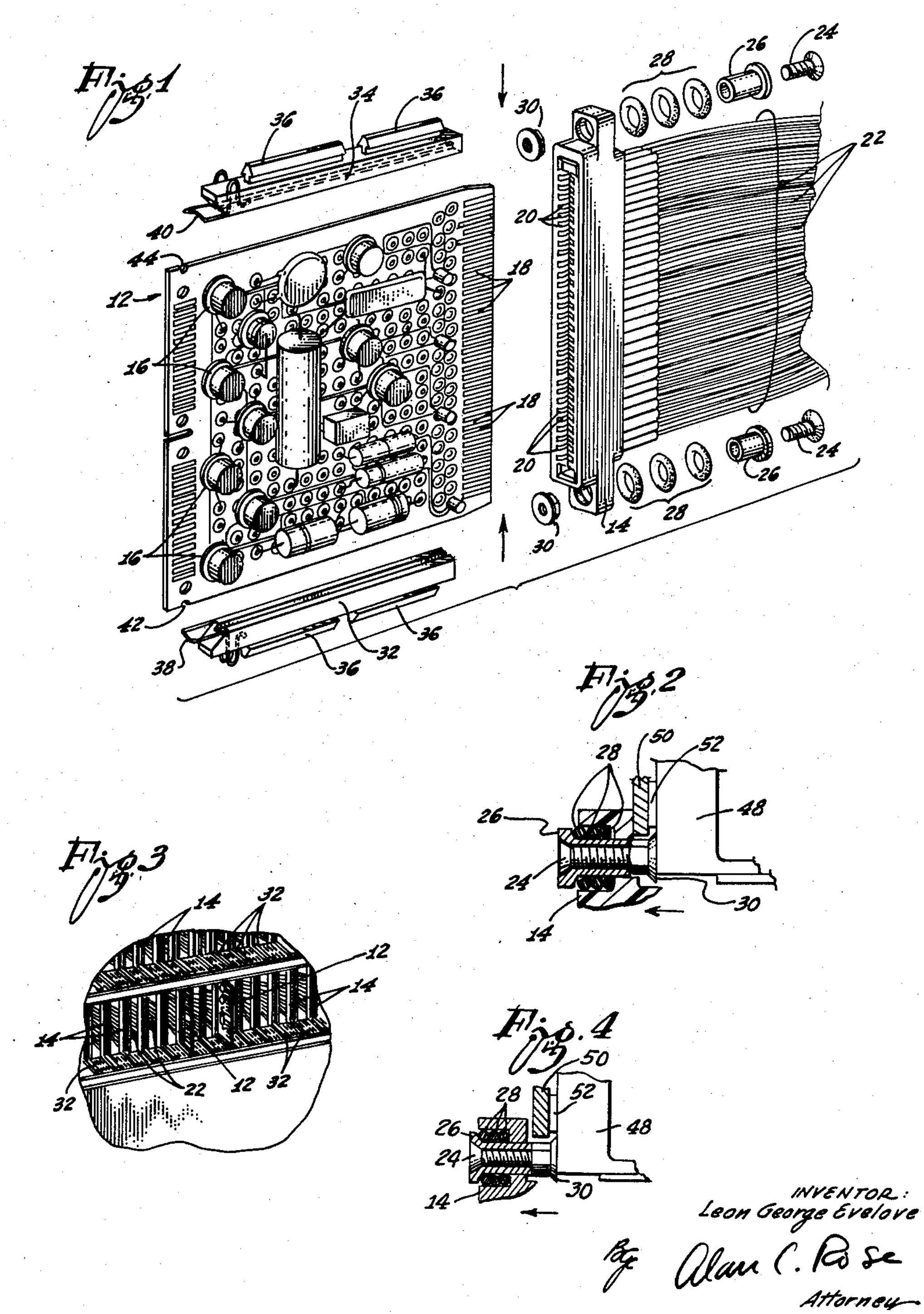
FIG. 1 is an exploded view of an illustrative printed circuit board, its associated connector receptacle and supporting members.
FIG. 2 is a detailed partial cross-sectional view of the resilient support for the connector receptacle assembly.
FIG. 3 shows a printed circuit board and associated receptacle mounted in a frame which supports the system hardware.
FIG. 4 is similar to FIG. 2, but shows the resilient support arrangements in the compressed state.

With reference to the drawings, FIG. 1 shows a printed circuit board 12 and a connector receptacle 14. The printed circuit board carries a number of electrical components such as the power transistors 16. The electrical connections from the transistors 16 to other circuit boards are accomplished by the interfitting contact members 18 on the board and the spring contacts 20 in the receptacle 14. The electrical signals at receptacle 14 are intercoupled with other components of the computer system through the wires 22. Each end of the receptacle 14 is resiliently mounted onto a main frame member of the computer by a screw 24, a bushing 26, three O-rings 28, and a nut 30. After passing through the nut 30, the screw 24 engages a frame member (shown in FIG. 2) which is located in the approximate position indicated by the arrows in FIG. 1. The function of the resilient mounting elements will be discussed in detail in connection with the cross-sectional assembly view of FIG. 2.

To facilitate mounting the circuit board 12 into the receptacle 14, two plastic guides 32 and 34, are provided. They each have grooves on their surfaces which face the edge of the circuit board 12. Each of the plastic guides also has two protrusions 36 which are employed in mounting the plastic guides into the main frame of the computer apparatus. Each of the protrusions 36 has a cross-sectional configuration which resembles an arrowhead. In practice, they are forcibly pushed into stamped openings in a sheet metal supporting member which forms a part of the main frame structure. This arrangement is clearly shown in FIG. 3 of the drawings. At the outer ends of the guide members 32 and 34 are spring hooks 38 and 40, respectively. These spring hooks 38 and 40 engage the notches 42 and 44, respectively, on the front corners of the printed circuit boards.

In operation, the printed circuit board 12 is inserted in the grooves of the plastic guide members 32 and 34 and pushed toward the rear into engagement with the receptacle 14. After fully engaging the receptacle 14, the board 12 is pushed back an additional 0.030 inch until the metal hooks 38 and 40 seat in the notches 42 and 44, respectively. This action compresses the O-rings 28 and moves the receptacle 14 out of direct engagement with the main frame members. This action will be explained in greater detail in connection with the assembly diagram of FIG. 2.

In FIG. 2 the parts are reversed from FIG. 1. The receptacle 14 is shown mounted onto the main frame member 48 of the computer apparatus. Rigidly secured to the frame member 48 are the connector bracket 50 and a spacer 52. The resilient mounting for the receptacle 14 includes the screw 24, the bushing 26 and the three O-rings 28, in addition to the nut 30, all of which are shown in the exploded view of FIG. 1. When the circuit board or card is inserted fully into the receptacle 14, it applies a force as indicated by the arrow in FIG. 2. This compresses the O-rings 28 and moves the connector receptacle 14 back from engagement with the connector bracket 50. Under these conditions, the connector receptacle 14 floats free of the main frame structure 48. It is therefore free to move or vibrate with the circuit board, and no relative movement between contacts 18 and 20 occurs. Contact wear is thus avoided and the remarkable improvement in circuit life tests which was noted above is produced.

FIG. 3 shows a circuit board 12 mounted in a frame to form part of a computing system. This figure also clearly shows a group of plastic guide members 32 and receptacles 14 for receiving additional circuit boards. The structural components shown in the views of FIGS. 1 and 2 are, of course, included in the assembly of FIG. 3.

FIG. 4 is similar to FIG. 2 but shows the circuit board connector strip 14 in its operative position with the O-rings 28 compressed and the connector strip 14 spaced from the connector bracket 50. This compression is a result of force applied to the circuit boards by the springs 38 and 40 as shown in FIG. 1.

It is to be understood that the above-described arrangements are illustrative of the application of the principles of the invention. Numerous other arrangements may be devised by those skilled in the art without departing from the spirit and scope of the invention. Thus, by way of example and not of limitation, the receptacle brackets may be resiliently mounted out of engagement with the frame members, even in the absence of pressure from the printed circuit boards, and the receptacles or connector strips may include latching mechanisms corresponding in function to the hooks 38 and 40 and the notches 42 and 44. Other structures known to the art may also be employed to accomplish the functions disclosed above. Accordingly, from the foregoing remarks, it is understood that the present invention is to be limited only by the spirit and scope of the appended claims.

What is claimed is:

1. A printed circuit board mounting arrangement comprising a main frame, a circuit board connector strip having a plurality of contacts, mounting means for resiliently biasing said connector strip against said frame, a printed circuit board having contacts arranged for resilient engagement with the contacts of said connector strip, and means for latching said circuit board into said connector strip against the force of said biasing means so that said strip is resiliently spaced from said main frame and the board is free to vibrate at high frequencies with respect to said frame, the stiffness of the circuit board-to-strip connections being greater than the stiffness of the resilient mounting of the connector strip onto the frame, whereby the circuit board and the connector strip may vibrate as a unit with respect to the frame.

2. A printed circuit board mounting arrangement comprising a main frame, a circuit board connector receptacle having a plurality of contacts, means for mounting said circuit board receptacle resiliently from said main frame with a predetermined stiffness, a printed circuit board having contacts arranged for resilient engagement with the contacts of said receptacle, and means for latching said boards to said frame without substantial restraint against high frequency vibration, the stiffness of the circuit board-to-receptacle connections being significantly greater than said predetermined stiffness.

3. An electrical system comprising a main supporting member, a plurality of circuit board connector strips each having a plurality of contacts, mounting means for resiliently biasing said connector strips against said support member, printed circuit boards having contacts arranged for resilient engagement respectively with the contacts of said connector strips, electrical conducting leads interconnecting said connector strips, and means for latching said circuit boards into said connector strips so that each of said strips is spaced from said main supporting member and the boards are secured into said strips without restraint against high frequency vibration with respect to said frame, the stiffness of the circuit board-to-strip connections being greater than the stiffness of the resilient mounting of the connector strips onto the frame, whereby each circuit board and its associated connector strip may vibrate as a unit with respect to the frame.

4. A printed circuit board mounting arrangement comprising a main frame, a circuit board connector strip having a plurality of contacts, means for mounting said connector strip resiliently from said main frame with a predetermined stiffness, and a printed circuit board free for high frequency vibration with respect to said frame and having contacts arranged for resilient engagement with the contacts of said connector strip, the stiffness of the circuit board-to-strip connections being significantly greater than said predetermined stiffness.

5. A printed circuit board mounting arrangement comprising a main frame, a circuit board connector strip having a plurality of contacts, mounting means for resiliently biasing said connector strip against said frame, a printed circuit board having contacts arranged for resilient engagement with the contacts of said connector strip, grooved plastic strips for guiding said boards into engagement with said strips, and means including spring wires secured to said plastic strips for latching said circuit board into said connector strip against the force of said biasing means so that said strip is resiliently spaced from said main frame and the board is free to vibrate at high frequencies with respect to the frame, the stiffness of the circuit board-to-strip connections being greater than the stiffness of the resilient mounting of the connector strip onto the frame, whereby the circuit board and the connector strip may vibrate as a unit with respect to the frame.

References Cited in the file of this patent

UNITED STATES PATENTS

| | | |
|---|---|---|
| 2,871,457 | Jencks et al. | Jan. 27, 1959 |
| 2,935,725 | Fox | May 3, 1960 |
| 2,993,187 | Bisbing et al. | July 18, 1961 |
| 3,003,131 | Nystuen | Oct. 3, 1961 |

OTHER REFERENCES

Lord: "Electronic Design," April 12, 1961, pages 58 and 59.